US005402029A

United States Patent [19]

Nakamura et al.

[11] Patent Number: 5,402,029

[45] Date of Patent: Mar. 28, 1995

[54] SURFACE ACOUSTIC WAVE DEVICE USING HIGHLY ORIENTED DIAMOND FILM

[75] Inventors: Rie Nakamura; Koji Kobashi, both of Kobe, Japan

[73] Assignee: Kabushiki Kaisha Kobe Seiko Sho, Kobe, Japan

[21] Appl. No.: 239,132

[22] Filed: May 6, 1994

[30] Foreign Application Priority Data

May 14, 1993 [JP] Japan ................................ 5-111990

[51] Int. Cl.[6] ................................ H01L 41/08

[52] U.S. Cl. ................................ 310/313 R

[58] Field of Search ................ 310/313 A, 313 R, 354

[56] References Cited

U.S. PATENT DOCUMENTS 3,109,153 10/1963 Rodek ................................ 310/354
4,084,130 4/1978 Holton ................................ 331/94.5 H
4,670,968 6/1987 Mikami et al. ................................ 29/576 B
4,868,444 9/1989 Shibata et al. ................................ 310/313 A
4,952,832 8/1990 Imai et al. ................................ 310/313 A
5,235,233 8/1993 Yamamoto ................................ 310/313 A

*Primary Examiner*—Thomas M. Dougherty
*Attorney, Agent, or Firm*—Oblon, Spivak, McClelland, Maier & Neustadt

[57] ABSTRACT

A surface acoustic wave device uses a highly oriented diamond film with a planar surface, increasing the propagating velocity of a surface acoustic wave, and fabricating many devices on a large area without polishing processes. The surface acoustic wave device includes the highly oriented diamond films, a piezoelectric film and electrodes which are formed on the diamond film. In the highly oriented diamond film, 80% or more of the surface area of the diamond film is composed of the (100) faces or (111) faces of diamond; and the difference $\{\Delta\alpha,\Delta\beta,\Delta\gamma\}$ between the Euler angles $\{\alpha,\beta,\gamma\}$ expressing the crystal orientations of the adjacent (100) or (111) faces of the diamond film simultaneously satisfies the relations of $|\Delta\alpha|\leqq 10°$, $|\Delta\beta|\leqq 10°$, and $|\Delta\gamma|\leqq 10°$.

10 Claims, 5 Drawing Sheets

SURFACE ACOUSTIC WAVE DEVICE USING HIGHLY ORIENTED DIAMOND FILM

BACKGROUND OF THE INVENTION

1. Field of the Invention

The present invention relates to a surface acoustic wave device using highly oriented diamond films, which is suitable for a high frequency filter.

2. Description of the Related Art

Diamond has a large band gap, and is excellent in stability against chemicals and radiation. It is thus expected to be used for devices operated in harsh environments. In particular, diamond has a property that the acoustic velocity is the highest therein among various materials. Recently, surface acoustic wave devices using the above property of diamond have been proposed in Unexamined Japanese Patent Publication Nos. Hei 1-62911, 1-233819, 1-236712, 1-808948, 2-20910, 2-137413, 2-239715, 3-175811, 3-204211 and 2-299309. Namely, in the above surface acoustic wave devices, by use of a diamond film as a substrate, the propagation velocity of the surface acoustic wave can be higher. Thus it is expected that surface acoustic wave devices in a GHz area can be fabricated.

In the conventional surface acoustic wave devices as a prototype, however, polycrystalline diamond films used as the substrates have a large surface roughness and contain a high density of crystal defects. As a result, the conventional devices fail to demonstrate the high propagation velocity theoretically expected for diamond. Moreover, the rough surface of the polycrystalline diamond film must be polished. As for the crystal defects, an epitaxial film grown on a single crystal diamond seems to contain less defects than the conventional polycrystalline diamond film. However, in this case, there occurs a problem due to its limited size of the substrate, which makes difficult to use the standard photolithography technique, reduce the cost, and achieve mass-production.

SUMMARY OF THE INVENTION

An object of the present invention is to provide a surface acoustic wave device using highly oriented diamond films capable of achieving a planar surface, increasing the propagation velocity of surface acoustic waves, and fabricating many devices on a large area without surface grinding.

To achieve the above object, according to the present invention, there is provided a surface acoustic wave device comprising of highly oriented diamond films, a piezoelectric layer, and an electrode layer which are formed on the diamond film. In the above surface acoustic wave device, the diamond film is formed by vapor-phase synthesis; 80% or more of the surface area of the diamond film is composed of the (100) or (111) faces of diamond; and the difference $\{\Delta\alpha,\Delta\beta,\Delta\gamma\}$ between the Euler angles $\{\alpha,\beta,\gamma\}$, expressing the crystal orientations of the adjacent (100) or (111) faces, which simultaneously satisfies the relations of $|\Delta\alpha|\leqq 10°$, $|\Delta\beta|\leqq 10°$, and $|\Delta\gamma|\leqq 10°$.

FIGS. 1(*a*) and 1(*b*) are typical views showing the structure of the surface of a diamond film in which (100) faces are highly oriented. The X-axis and the Y-axis, crossing at right angles to each other, are defined within the film surface plane, and the normal direction of the film surface plane is defined as the Z-axis. The Euler angles, expressing the crystal orientations of the i-th and j-th diamond crystal faces, are expressed by $\{\alpha_i,\beta_i,\gamma_i\}$, and $\{\alpha_j,\beta_j,\gamma_j\}$, respectively, and the angle difference therebetween is defined by $\{\Delta\alpha,\Delta\beta,\Delta\gamma\}$.

The Euler angles $\{\alpha,\beta,\gamma\}$ express the crystal orientation obtained by rotating the reference crystal face around the X-axis, Y-axis and Z-axis of the reference coordinates in the order of the angles $\alpha$, $\beta$, and $\gamma$.

According to the present invention, the highly oriented diamond film simultaneously satisfies the relations of $|\Delta\alpha|\leqq 10°$, $|\Delta\beta|\leqq 10°$ and $|\Delta\gamma|\leqq 10°$; thus, crystals are highly oriented, and the mobility of carriers is as high as that in the single crystal diamond film.

In the (111) face, similarly, when the absolute value of each angle difference between the Euler angles is 10° or less, the crystals are highly oriented, and the mobility of the carriers is also high. Such a highly oriented diamond film can be formed by the steps of carburising a mirror-finished silicon substrate, irradiating a microwave in a vapor phase containing methane gas while applying a negative bias on the substrate, and growing out the film.

The high oriented diamond films can be entirely insulating diamond, or entirely or partially semiconducting diamond doped with impurities such as boron (B). The piezoelectric layer is composed a material containing at least one kind of compound selected from a group consisting of ZnO, AlN, $Pb(Zr, Ti)O_3$, $(Pb, La)(Zr, Ti)O_3$, $LiTaO_3$, $LiNbO_3$, $SiO_2$, TaO, $Nb_2O_5$, BeO, $Li_2B_4O_7$, $KNbO_3$, ZnS, ZnSe, CdS and SiC.

The highly oriented diamond film has a more planar surface and less crystal defects compared with the conventional polycrystalline diamond film, so that the propagation velocity of acoustic waves is higher compared with that of the conventional polycrystalline diamond film, thus making it possible to fabricate the device securing the propagation velocity similar to the theoretical value for diamond. Moreover, the surface is planar, so that the polishing process is not required. However, if the absolute value of each difference between the Euler angles exceeds 10°, the orientations of the crystal surfaces of diamond particles are shifted from the orientations of the substrate, increasing the surface roughness, thereby requiring the polishing process. In the polishing process, defects tend to be introduced in the film, which exerts adverse effect on the propagation velocity. Moreover, the highly oriented diamond film enables the substrate area to be larger than the single crystal, so that the standard photolithography technique can be utilized, to form a plurality of devices on the same substrate. As a result, the surface acoustic wave device of the present invention can be used in the high frequency region, reduced in size, and easily fabricated on a large scale.

The surface acoustic wave device of the present invention is applicable for filter, resonance element, phase converter, amplifier, convolver, programmable filter, correlation device, memory element, signal processing element, delay line and delay line type VCO.

DETAILED DESCRIPTION OF THE PREFERRED EMBODIMENTS

Hereinafter, embodiments of the present invention will be described with reference to the accompanying drawings.

Figure 1A:
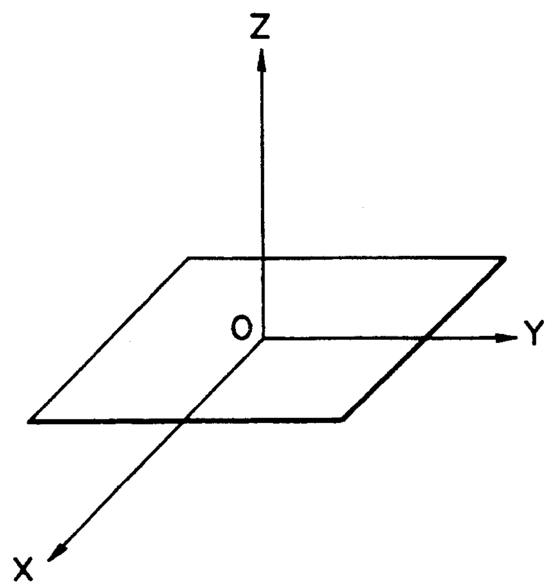
FIGS. 1(*a*) and 1(*b*) are typical views showing a relationship between the surface of a highly oriented diamond film and the Euler angles, wherein FIG. 1(*a*) shows the reference surface orientation, and FIG. 1(*b*) shows the surface of a diamond film in which (100) faces are highly oriented.
Figure 1B:
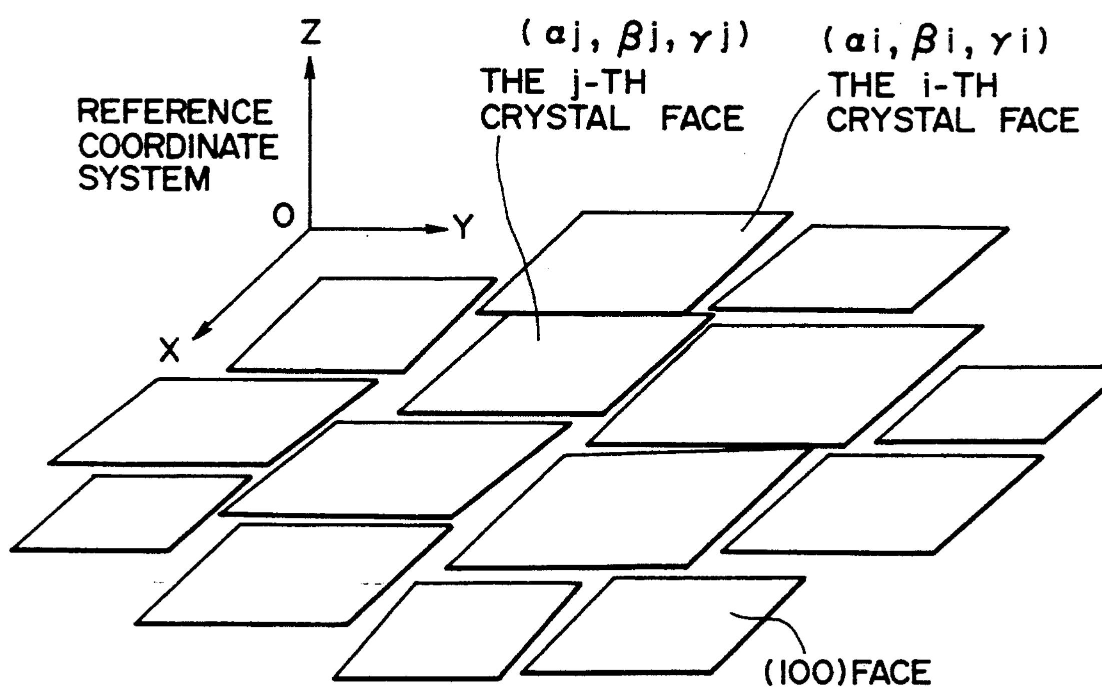
Figure 2:
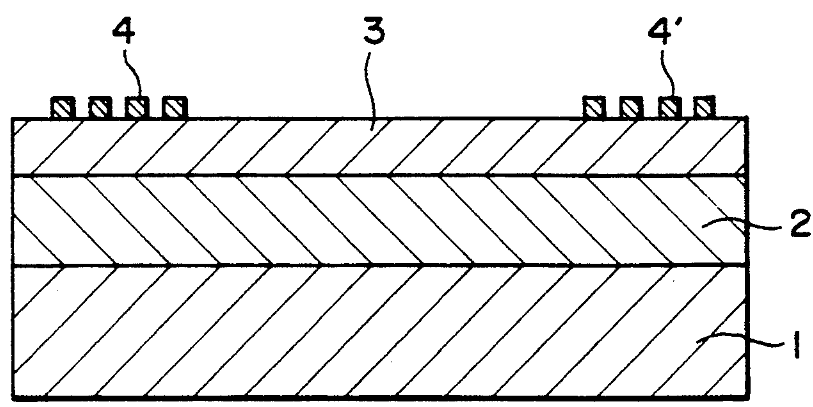
FIG. 2 is a cross-sectional view showing a surface acoustic wave device according to a first embodiment of the present invention.

FIG. 2 is a cross-sectional view showing a surface acoustic wave device according to a first embodiment. A highly oriented diamond film 2 is formed on a substrate 1, and a piezoelectric film 3 is formed on the highly oriented diamond film 2. Metal electrodes 4 and 4' are formed on the piezoelectric film 3. Each of the metal electrodes 4 consists of a pair of comb-type electrodes.

In this surface acoustic wave device, when a voltage is applied between the pair of metal electrode 4, an acoustic wave is generated on the surface of the piezoelectric film 3, and propagates to the other pair of metal electrodes 4'. The acoustic wave is detected at the pair of metal electrode 4'. In this embodiment, the propagation velocity of the acoustic wave is significantly large, because the highly oriented film with a very planar surface is disposed under the piezoelectric layer 3.

Figure 3:
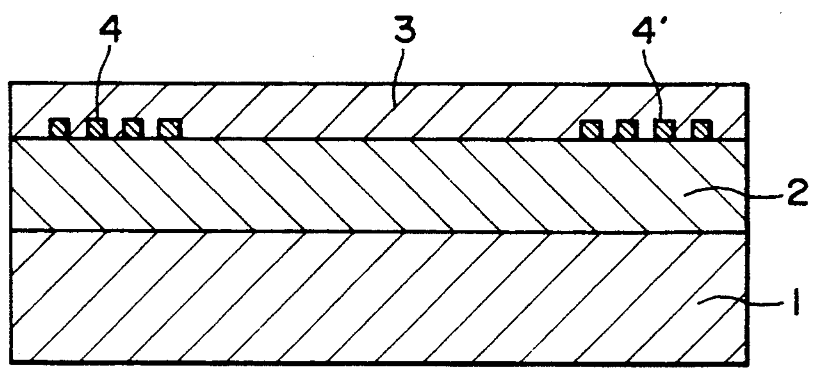
FIG. 3 is a cross-sectional view showing a surface acoustic wave device according to a second embodiment of the present invention.

FIG. 3 is a cross-sectional view showing a surface acoustic wave device according to a second embodiment of the present invention. In this embodiment, metal electrodes 4 and 4' are formed on a highly oriented diamond film 2, and a piezoelectric film 3 is provided on the highly oriented diamond film 2 so as to cover the metal electrodes 4 and 4' and the highly oriented diamond film 2. The surface acoustic wave device in this embodiment propagates in the same manner as in the first embodiment.

Figure 4:
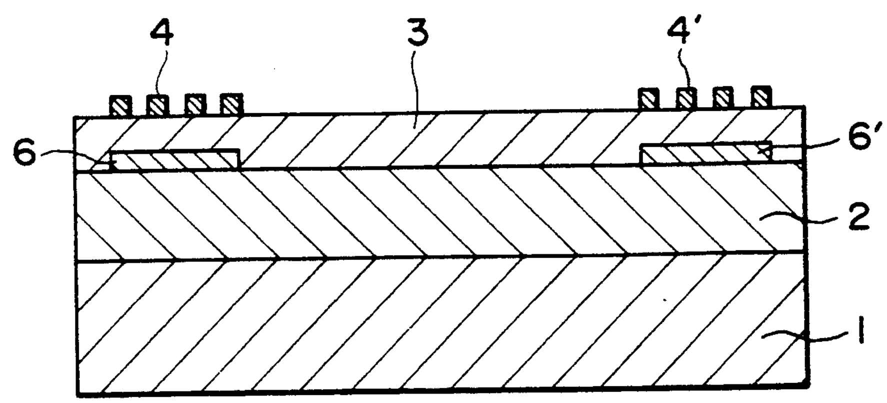
FIG. 4 is a cross-sectional view showing a surface acoustic wave device according to a third embodiment of the present invention.

FIG. 4 is a cross-sectional view showing a surface acoustic wave device according to a third embodiment of the present invention. This embodiment is the same as the first embodiment shown in FIG. 2, except that metal electrodes 6 and 6' facing to the metal electrodes 4 and 4' are also provided on the surface of the highly oriented diamond film 2.

The metal electrode 4 and the facing electrode 6 are each comb-type electrodes, which are disposed such that the arrangement directions of the comb-teeth cross at right angles to each other. By disposing the metal electrode 4 and the facing electrode 6 which are each composed of the comb-type electrode so as to hold the piezoelectric film 3 therebetween, the phase velocity and the like can be adjusted.

Figure 5:
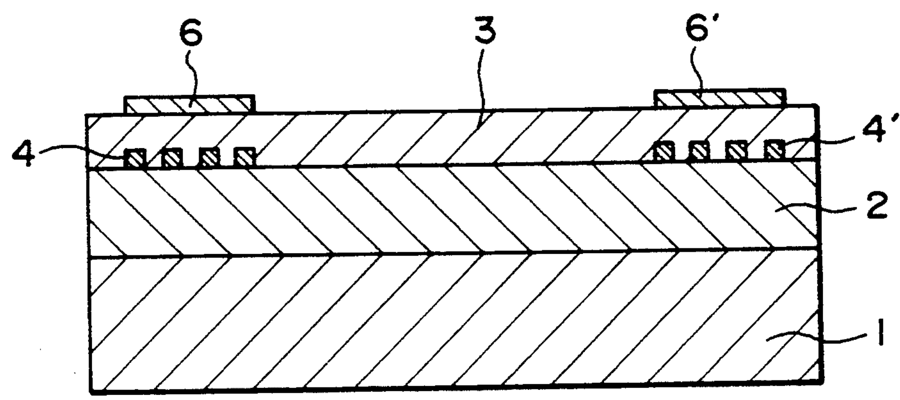
FIG. 5 is a cross-sectional view showing a surface acoustic wave device according to a fourth embodiment of the present invention.

FIG. 5 is a cross-sectional view showing a surface acoustic wave device according to a fourth embodiment of the present invention. This embodiment is the same as the second embodiment, except that metal electrodes 6 and 6' are provided on the surface of the piezoelectric film 4. This embodiment has the same effect as that of the embodiment 4.

Figure 6:
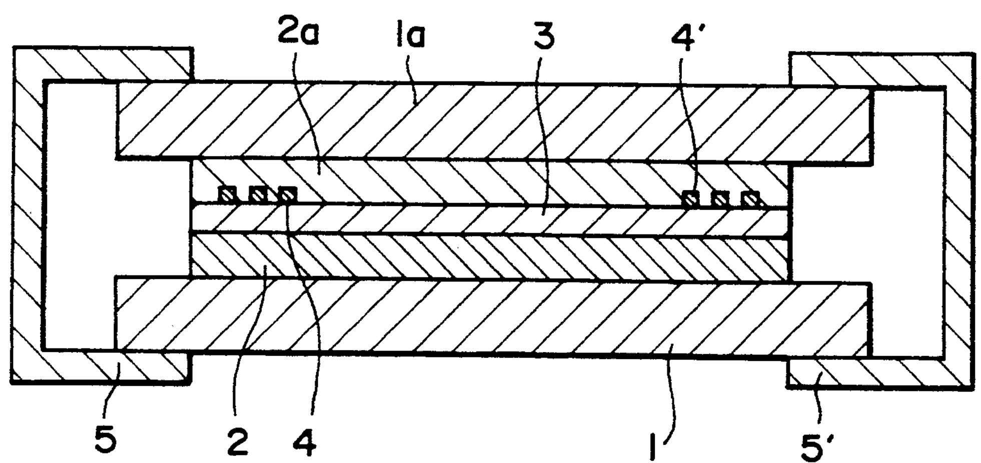
FIG. 6 is a cross-sectional view showing a surface acoustic wave device according to a fifth embodiment of the present invention.

FIG. 6 is a cross-sectional view showing a surface acoustic wave device according to a fifth embodiment of the present invention. In this embodiment, first, an element, in which a highly oriented undoped diamond film 2a is formed on a substrate 1a, is prepared. Next, this element and the surface acoustic wave device of the first embodiment 1 shown in FIG. 2 are overlapped such that the highly oriented undoped diamond film 2a is contacted with the piezoelectric film 3, and they are then clamped to each other by clamps 5 and 5'. In this way, by overlapping the undoped insulating highly oriented diamond film 2a on the metal electrodes 4 and 4' and the piezoelectric film 3, and clamping them by the clamps 5 and 5', the acoustic wave propagates along the interface with the diamond film 2a, and is thereby high, resulting in the fact that the element can be operational at higher frequencies.

The piezoelectric film layer is covered with the diamond film, or clamped to the diamond film, to form a sandwich structure, so that the bulk modes in the diamond films are coupled to each other depending on the thickness of the diamond film. Conventionally, this bulk mode has not been utilized; however, the propagation velocity of this mode is higher than that of the surface mode, which enables the element to be easily applicable for the GHz area. Even when used in the conventional frequency band, the device can be fabricated using the standard photolithography technique, resulting in an improved yield.

Figure 7:
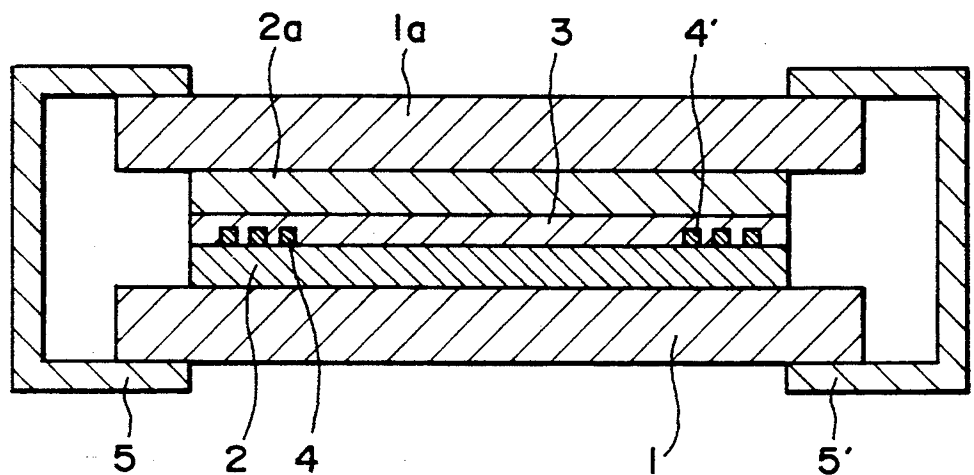
FIG. 7 is a cross-sectional view showing a surface acoustic wave device according to a sixth embodiment of the present invention.

Moreover, FIG. 7 is a cross-sectional view of a surface acoustic wave device according to a sixth embodiment of the present invention. In this embodiment, a laminated body of a highly oriented undoped diamond film 2a and a substrate 1a are overlapped on the surface acoustic wave device of the second embodiment shown in FIG. 3, which are clamped to each other by clamps 5 and 5'.

This embodiment 5 has the same effect as in the fifth embodiment.

In each embodiment, since the highly oriented diamond film 2 is significantly flat, the surface of the piezoelectric film 3 formed thereon is also significantly flat, thereby improving the propagating efficiency of the surface acoustic wave.

In this case, the electrodes 4 and 6 may be composed of highly oriented diamond films, to improve the adhesiveness between the highly oriented diamond film 2 and the electrode diamond films.

Example 1

(Step 1)

The surface acoustic wave device of the second embodiment shown in FIG. 3 was fabricated, and its characteristics were evaluated. As a substrate for a highly oriented diamond film, a silicon wafer (diameter: 1 inch) of (100) cut was used. The substrate was put in a microwave chemical vapor deposition system, and treated using a reaction gas of 3 volume % of methane and 97 volume % of hydrogen at a gas pressure of 25 Torr, gas flow rate of 300 cc/min, and a substrate temperature of 700° C. The microwave input power was about 1000 W, and finely adjusted to maintain the substrate temperature at 700° C. At the same time, a negative bias is applied to the substrate, with a current of 10 $mA/cm^2$.

(Step 2)

After that, deposition was made for 80 hr using a reaction gas of a methane of 0.5 volume %, hydrogen of 99.4 volume % and oxygen of 0.1 volume %, at a gas pressure of 35 Torr, a gas flow rate of 300 cc/min and a substrate temperature of 800° C. As a result, a highly oriented diamond film having a thickness of about 20 μm was formed. Moreover, from the electron microscopic observation, it was revealed that about 95% of the film surface was covered with the (100) faces. Moreover, from the cross-sectional photograph of the film, the difference between the crystal faces was 0.1 μm or less.

Moreover, the orientation of each (100) face was measured by taking two electron microscopic photographs along the directions away from the film normal by an angle of ±5°. The orientational difference between the adjacent crystal faces was $|\Delta\alpha| \leqq 10°$, $|\Delta\beta| \leqq 10°$ and $|\Delta\gamma| \leqq 10°$. Next, an Al film was formed on the highly oriented diamond film to a thickness of about 2000 Å. A photoresist was then coated by the common photolithography, and the pattern was exposed using a mask, to form an electrode pattern by development, after which the etching was made. Thus a comb-type electrode of normal mode having an electrode gap of 2 μm was formed. A ZnO film for the piezoelectric film was formed thereon to a thickness of about 0.8 μm. The filter characteristic of the element thus fabricated was evaluated, with a result that the high center frequency of 1.25 GHz was obtained.

Example 2

The experiments were repeated in the same manner as in Example 1, except that the condition of (Step 1) was changed as shown in Test Nos. 2 to 5 in Table 1. The elements fabricated in the conditions of the Test Nos. 1 to 5 were referred to as Samples 1 to 5, respectively. Additionally, the condition of Test No. 1 is the same as the condition of the Step 1.

TABLE 1

| Test Nos. | methane conc. (%) | hydrogen conc. (%) | reference temp. (°C.) |
|---|---|---|---|
| 1 | 3.0 | 97.0 | 700 |
| 2 | 3.2 | 96.8 | 720 |
| 3 | 3.4 | 96.6 | 650 |
| 4 | 3.8 | 96.2 | 750 |
| 5 | 4.0 | 96.0 | 800 |

As a result, in Sample 2, 90% or more of the film surface was covered with the (100) faces, and 10% of the film surface was gaps between the faces. In any of the adjacent crystal faces, Δα, Δβ, and Δγ were $|\Delta\alpha| \leqq 10°$, $|\Delta\beta| \leqq 10°$ and $|\Delta\gamma| \leqq 10°$. On the contrary, in Samples 4 and 5, 77% or 73% of each film surface was covered with the (100) faces, and in any of the adjacent crystal faces, Δα, Δβ, and Δγ were $|\Delta\alpha| > 10°$, $|\Delta\beta| > 10°$ and $|\Delta\gamma| > 10°$. In Sample 3, 80% of the film surface was covered with the (100) faces, each of the absolute values of Δα, Δβ, and Δγ of was less or more 10°. As in Example 1, surface acoustic wave devices were fabricated using Sample Nos. 1 to 5, which were examined for the propagation velocity by the filter characteristic. At this time, the diamond film was not subjected to surface grinding.

Figure 8:
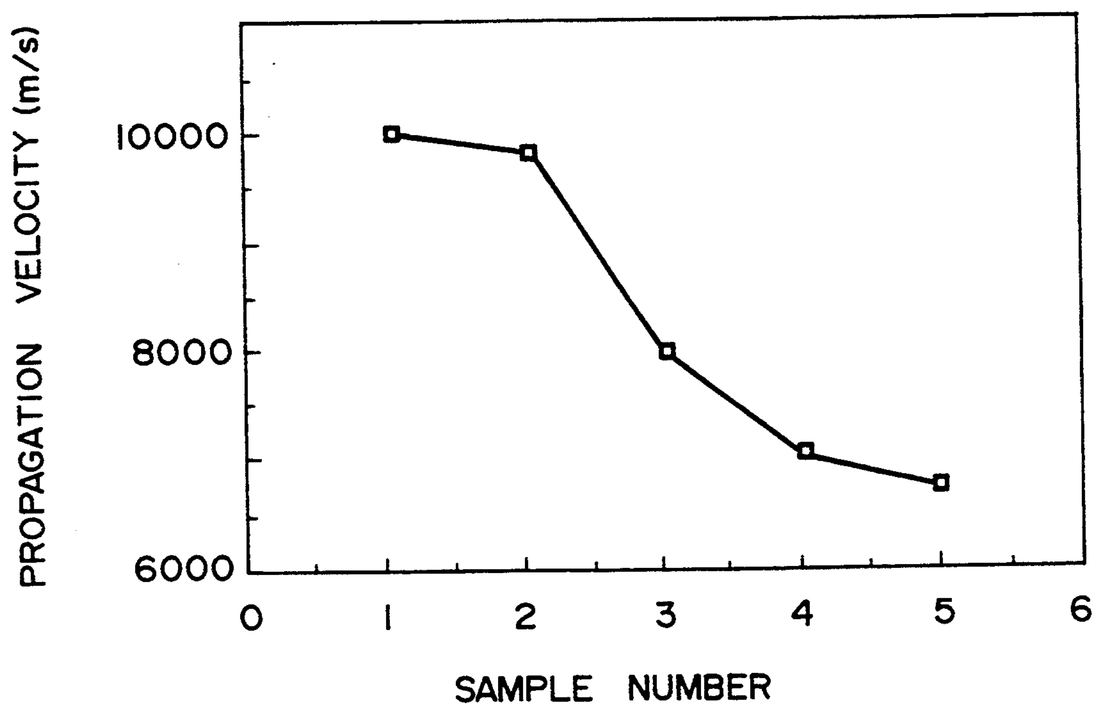
FIG. 8 is a graph showing a measurement results of propagation velocities of the embodiments and comparative examples.

The measured results thus obtained were shown in FIG. 8. From this figure, it was revealed that Inventive Samples 1 and 2 are quite different in the propagation velocity from Comparative Samples 4 and 5.

As described above, according to the present invention, since a highly oriented diamond film satisfying a specific requirement is provided under a piezoelectric layer, the surface of the piezoelectric layer is made significantly flat, to significantly increase the propagation velocity of a surface acoustic wave. Moreover, according to the present invention, multiple surface acoustic wave devices can be formed on a large area without a polishing process.

What is claimed is:

1. A surface acoustic wave device using a highly oriented diamond film, comprising:

a highly oriented diamond film formed by vapor-phase synthesis; and a piezoelectric layer and an electrode layer which are formed on said diamond film;

wherein 80% or more of the surface area of said diamond film is composed of the (100) faces of diamond; and the difference {Δα,Δβ,Δγ} between the Euler angles {α,β,γ} expressing the crystal orientations of the adjacent (100) faces of said diamond film simultaneously satisfies the relations of $|\Delta\alpha| \leqq 10°$, $|\Delta\beta| \leqq 10°$, and $|\Delta\gamma| \leqq 10°$.

2. A surface acoustic wave device using a highly oriented diamond film, comprising:

a highly oriented diamond film formed by vapor-phase synthesis; and a piezoelectric layer and an electrode layer which are formed on said diamond film;

wherein 80% or more of the surface area of said diamond film is composed of the (111) faces of diamond; and the difference {Δα,Δβ, Δγ} between the Euler angles {α, β, γ} expressing the crystal orientations of the adjacent (111) faces of said diamond film simultaneously satisfies the relations of $|\Delta\alpha| \leqq 10°$, $|\Delta\beta| \leqq 110°$, and $|\Delta\gamma| \leqq 10°$.

3. A surface acoustic wave device using a highly oriented diamond film according to claim 1 or 2, wherein one or more layers of said diamond films are formed by vapor-phase synthesis on the whole or partial surfaces of said piezoelectric layer and said electrode layer, and which are clamped thereto;

80% or more of the surface area of said diamond film is composed of the (100) face of diamond; and the difference {Δα,Δβ,Δγ} between the Euler angles {(α,β,γ} expressing the crystal orientations of the adjacent (100) faces of said diamond film simultaneously satisfies the relations of $|\Delta\alpha| \leqq 10°$, $|\Delta\beta| \leqq 10°$, and $|\Delta\gamma| \leqq 10°$.

4. A surface acoustic wave device using a highly oriented diamond film according to claim 1 or 2, wherein one or more layers of said diamond films are formed by vapor-phase synthesis on the whole or partial surfaces of said piezoelectric layer and said electrode layer, and which are clamped thereto;

80% or more of the surface area of said diamond film is composed of the (111) face of diamond; and the difference $\{\Delta\alpha,\Delta\beta,\Delta\gamma\}$ between the Euler angles $\{\alpha,\beta,\gamma\}$ expressing the crystal orientations of the adjacent (111) faces of said diamond film simultaneously satisfies the relations of $|\Delta\alpha| \leqq 10°$, $|\Delta\beta| \leqq 10°$, and $|\Delta\gamma| \leqq 10°$.

5. A surface acoustic wave device using a highly oriented diamond film according to any one of claims 1 or 2, wherein all of said highly oriented diamond films comprise insulating diamond films.

6. A surface acoustic wave device using a highly oriented diamond film according to any one of claims 1 or 2, wherein all or part of said highly oriented diamond films comprise semi-conducting diamond films doped with impurities such as boron (B).

7. A surface acoustic wave device using a highly oriented diamond film according to claim 3, wherein all of said highly oriented diamond films comprise insulating diamond films.

8. A surface acoustic wave device using a highly oriented diamond film according to claim 4, wherein all of said highly oriented diamond films comprise insulating diamond films.

9. A surface acoustic wave device using a highly oriented diamond film according to claim 3, wherein all or part of said highly oriented diamond films comprise semi-conducting diamond films doped with impurities such as boron (B).

10. A surface acoustic wave device using a highly oriented diamond film according to claim 4, wherein all or part of said highly oriented diamond films comprise semi-conducting diamond films doped with impurities such as boron (B).

* * * * *